US007030692B2

(12) United States Patent
Chiu

(10) Patent No.: US 7,030,692 B2
(45) Date of Patent: Apr. 18, 2006

(54) CIRCUIT AND METHOD FOR CONTROLLING GAIN IN AN AMPLIFIER

(75) Inventor: Janice Chiu, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 80 days.

(21) Appl. No.: 10/806,139

(22) Filed: Mar. 23, 2004

(65) Prior Publication Data

US 2005/0212600 A1 Sep. 29, 2005

(51) Int. Cl.
*H03G 3/20* (2006.01)

(52) U.S. Cl. ....................................... 330/140; 330/279

(58) Field of Classification Search ................ 330/140, 330/279

See application file for complete search history.

(56) References Cited

U.S. PATENT DOCUMENTS 4,955,075 A * 9/1990 Anderson ................ 455/182.2
5,901,347 A * 5/1999 Chambers et al. ....... 455/234.1
6,484,042 B1 * 11/2002 Loke ....................... 455/550.1

* cited by examiner

*Primary Examiner*—Khanh V. Nguyen
(74) *Attorney, Agent, or Firm*—Squire, Sanders & Dempsey L.L.P.

(57) ABSTRACT

A circuit is provided for controlling the gain of an amplifier, such as an amplifier that may be used in telecommunication devices. The circuit includes an analog portion that receives signals from one or more mixers and that produces an output that is an inverse logarithmic function of the input signal. The output signal is digitally processed by a digital portion of the circuit, which determines whether gain of the amplifier should be increased, decreased, or held constant. Also, methods are provided for controlling the gain of an amplifier.

19 Claims, 6 Drawing Sheets output
185
187
195
190
VDD
180
105
165
140
135
130
160
155
145
150
Node A
175
170
LNA
110
115
120
125
100

AMPLIFIER GAIN
low-
to-high
high-to-
low
3mV
30mV
210
200
input signal at
V

V
40
30
20
10
output
A
B
C
D
3mV
30mV
100
input (log)
210
200

VDDA
GNDA
IN
VTH_HL
VTH_LH
BIAS
O1
O2
187
300
comp1
BN
GNDRX
INN
INP
VDDRX
OUT
PDBX
I0
I1
310
inv3x
I3
I2
VDDINT
GNDINT
GNDS
OO1
OO2
315
320
nand2
I9
I10
GNDINT
GNDS
A
B
VDDINT
VDDS
Y
OUT
VTH_HL
VTH_LH
8bit CMREF
IR
VDDRX
pdbx
BIAS_P
BIAS_RECA
BIAS_CAS_RECA
VCP
BIAS
BIAS_CAS
CMREF
M52
pdx
IR
GNDRX
420
410
R9
VTH_LH
VTH_HL
B0
B1
B2
B3
B4
B5
B6
B7
400

CIRCUIT AND METHOD FOR CONTROLLING GAIN IN AN AMPLIFIER

BACKGROUND OF THE INVENTION

1. Field of the Invention

Certain embodiments of the present invention relate generally to circuits configured to control amplifiers. Certain other embodiments of the present invention relate generally to methods for controlling amplifiers.

2. Description of the Related Art

Wide-Band Received Signal Strength Indicator (WRSSI) circuits are commonly used in electronic systems that include mixers and amplifiers such as, for example, automatic-gain controlled amplifiers (ACG). In such systems, the WRSSI circuits control the gain of one or more of the amplifiers that are outside of the WRSSI circuit.

Commonly-used WRSSI circuits generally receive signals from an outside amplifier after the signals have passed through at least two mixers. For example, amplifier signals may be received by a WRSSI circuit from an I mixer and a Q mixer, whose outputs are 90° out-of-phase with each other. Common WRSSI circuits then process these signals independently through separate paths. Hence, since providing multiple paths requires the inclusion of redundant components, commonly-used WRSSI circuits are relatively large, require a considerable amount of power for operation, and are relatively difficult to cool. Further, currently-available WRSSI circuits are typically highly sensitive to variations in temperature, process, and power supply voltage.

SUMMARY OF THE INVENTION

Certain embodiments of the present invention include electronic circuits for controlling the gain of a first amplifier that is operably connected to a circuit. According to certain embodiments of the present invention, such a circuit often include a first portion for receiving a first input signal and a second input signal from a second amplifier. Typically, this first portion produces a first output signal that is an inverse logarithmic function of a combination of the first input signal and the second input signal. Commonly, such circuits also include a second portion for digitally processing the first output signal and to produce a second output signal that controls the gain of the first amplifier.

Embodiments of the present invention also include methods of controlling gain in a first amplifier. Such methods include a step of receiving a first input signal and a second input signal from a second amplifier in a first portion of a circuit. Typically, such methods include a step of producing a first output signal in the first portion, wherein the first output signal is an inverse logarithmic function of a combination of the first input signal and the second input signal. Often, these methods also include the step of forwarding the first output signal to a second portion of the circuit and digitally processing the first output signal in the second portion to produce a second output signal. Normally, such methods also include the step of controlling the gain of the first amplifier using the second output signal.

According to yet other embodiments of the present invention, other circuits configured to control the gain of a first amplifier are provided. The circuits typically include receiving means or receiving a first input signal and a second input signal from a second amplifier. Generally, first production means are also included in such circuits for producing a first output signal that is an inverse logarithmic function of a combination of the first input signal and the second input signal. In addition, such circuits often include processing means for digitally processing the first output signal and second production means for producing a second output signal that controls the gain of the first amplifier.

BRIEF DESCRIPTION OF THE DRAWINGS

For proper understanding of the invention, reference should be made to the accompanying drawings, wherein.

DETAILED DESCRIPTION OF THE PREFERRED EMBODIMENT(S)

Figure 1:
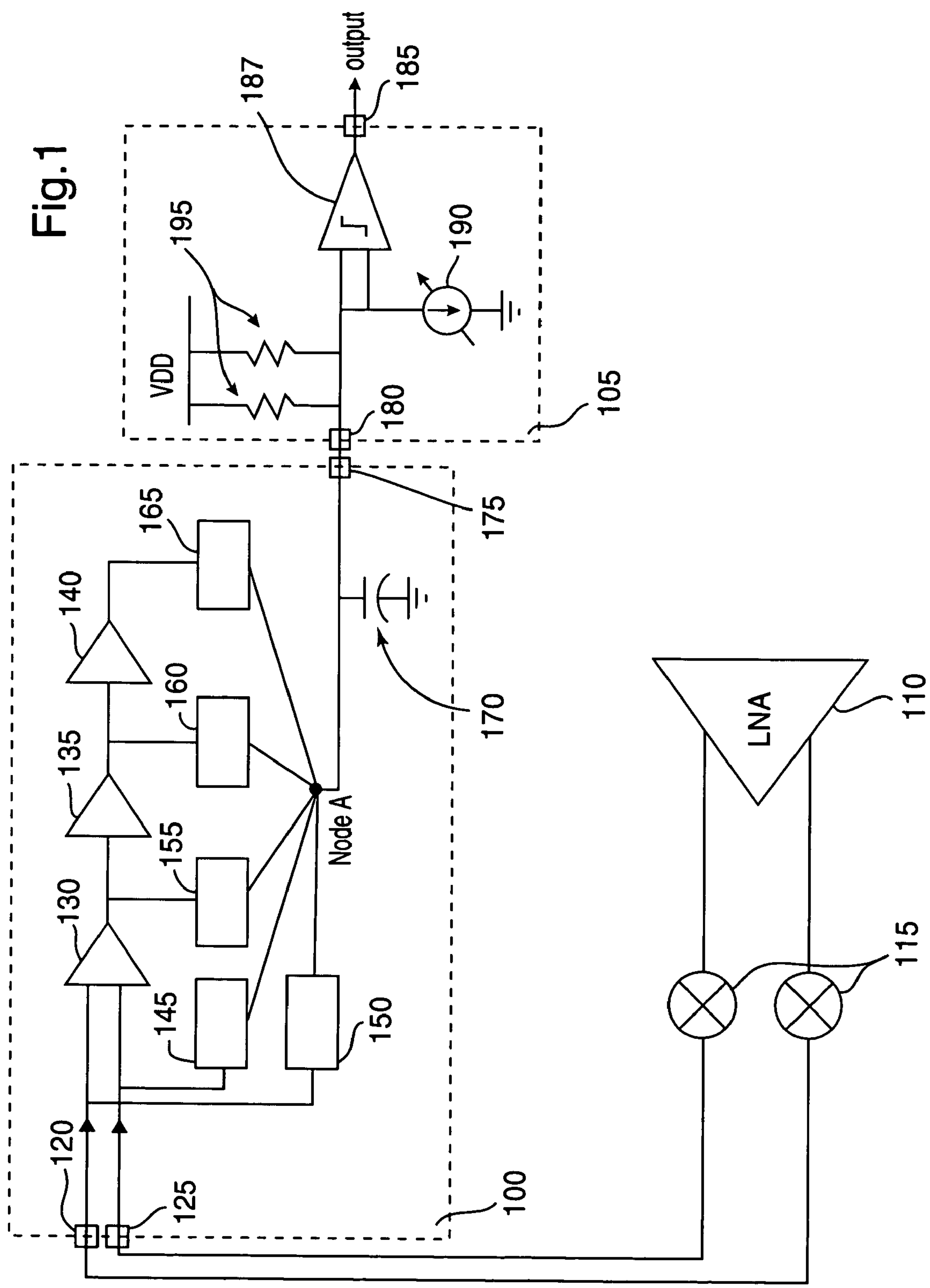
FIG. 1 illustrates a schematic representation of a low-noise amplifier (LNA), a set of mixers, and a circuit configured to control the gain of the LNA.

FIG. 1 illustrates first portion 100 and second portion 105 of a representative circuit according to an embodiment of the present invention. The representative circuit illustrated in FIG. 1 is configured to control the gain of an amplifier outside of the circuit. For example, using the circuit illustrated in FIG. 1, the gain of low-noise amplifier (LNA) 110 may be controlled.

Operably connected between LNA 110 and first portion 100 are two mixers 115 that are typically double-balanced I/Q mixers. Usually, mixers 115 are used to translate the frequency of signals forwarded by LNA 110 to the circuit before these signals reach first input 120 and second input 125 of first portion 100. In FIG. 1, mixers 115 may take the form of a set of I & Q mixers that process differential signals from LNA 110. Typically, mixers 115 are driven by IQ linear oscillator (LO) signals that are 90° out-of-phase with each other, respectively.

First portion 100 is commonly referred to herein as the analog portion of the circuit illustrated in FIG. 1 and typically includes several internal amplifiers and rectifiers. In the embodiment of the analog portion illustrated in FIG. 1, three amplifiers 130, 135, 140 and five rectifiers 145, 150, 155, 160, 165 are operably connected to each other, to input ports 120, 125, and to output port 175 in the circuit. Signals from the rectifiers converge at Node A, where the signals are combined.

Also included in representative first portion 100 is capacitor 170. Capacitor 170, in combination with resistors 195, provides a resistor-capacitor (RC) filter that helps filter and smooth signals that are output from first portion 100 and forwarded to second portion 105.

While the circuit illustrated in FIG. 1 is in operation, LNA 110 typically forwards Radio Frequency (RF) signals to mixers 115, and mixers 115 typically translate the RF signals into Intermediate Frequency (IF) signals that are forwarded to first portion 100. After receiving signals from mixers 115 at ports 120, 125, first portion 100 generally produces a first output signal that is emitted from portion 100 through output 175. Due to the rectifier configuration used in the circuit, this emitted signal is an inverse logarithmic function of a combination of the signals received at ports 120, 125.

In the device illustrated in FIG. 1, when signals are received by both first input port 120 and second input port 125, because each port 120, 125 is electrically connected to amplifier 130 and rectifiers 145 and 150, a portion of each received signal travels into first amplifier 130, and a portion of each received signal travels into each of first rectifier 145 and second rectifier 150. Then, as mentioned above, at Node A, the above-listed portions of the signals are recombined into a single output signal that is then emitted from first output port 175 to input port 180 of second portion 105.

Second portion 105, which is referred to herein as a digital portion, is typically configured to receive, through input port 180, the single-ended output signal that is emitted from first output port 175. Second portion 105 is also typically configured to digitally process the output signal received from first portion 100 and to produce a second output signal that may be used to control the gain of LNA 110 and/or other outside amplifiers that may be operably connected, either directly or indirectly, to second portion 105. This second output signal is typically emitted from second portion 105 through second output port 185.

Also illustrated in second portion 105 in FIG. 1 are resistors 195. These provide a connection between or, in other words, short, third input port 180 and voltage drain (VDD) which may, according to certain embodiments, equal the voltage of the power supply for the WRSSI circuit.

Second portion 105 usually includes at least one comparator circuit 187 and is generally configured to compare a value related to the first output signal received from first portion 100 (for example, a value related to the amplitude of the first output signal) to one or more threshold values. Commonly, when a threshold value is reached, the comparator circuit 187 is configured to at least initiate switching of the gain of an outside amplifier, such as LNA 110, either from high to low or from low to high, depending on what kind of threshold value has been reached.

Figure 2B:
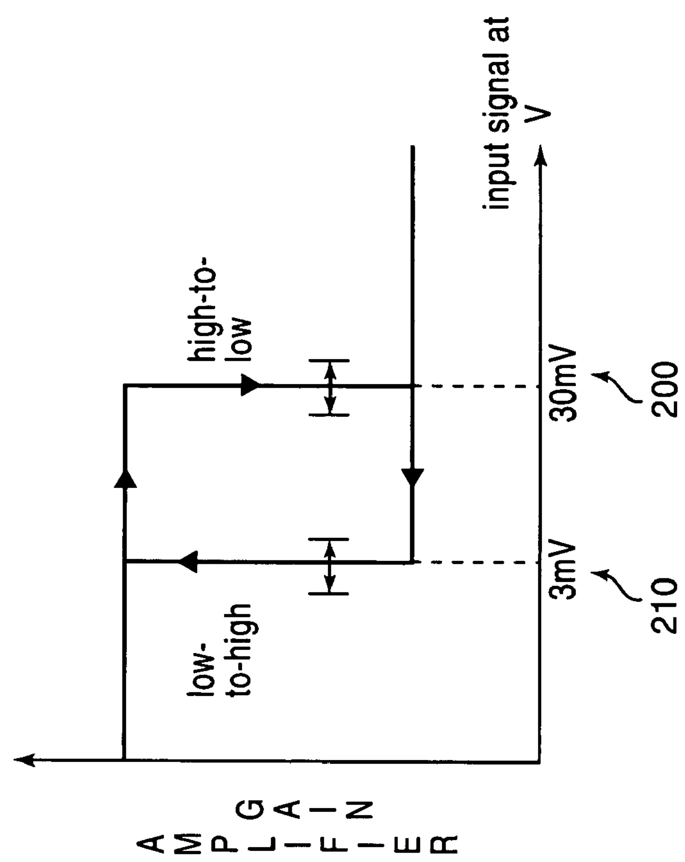
FIG. 2B includes a graph that illustrates thresholds at which a circuit configured to control the gain of an outside amplifier switches the gain from high to low and from low to high.

In other words, as illustrated in FIG. 2B, when an input signal at input port 120 and/or input port 125 reaches or exceeds a first input threshold value 200 (for example, 30 mV in FIG. 2B), the gain of the outside amplifier is switched between a high level and a low level. To effectuate this change, output port 175 forwards a signal that, after having passed through the amplifiers and rectifiers of analog portion 100, has a value that is at or below a first output threshold value (for example, 782 mV). Then, portion 105 recognizes that a threshold has been reached and the gain of LNA 110 is switched from a high value to a low value.

Conversely, when the value of the input signal at input port 120 and/or input port 125 is equal to or lower than a second input threshold value 210 (for example, 3 mV in FIG. 2B), output port 175 forwards a signal having a value at or above a second output threshold value (for example, 928 mV). Then, portion 105 again recognizes that a threshold has been reached, and the gain of LNA 110 is switched from low to high.

Figure 2A:
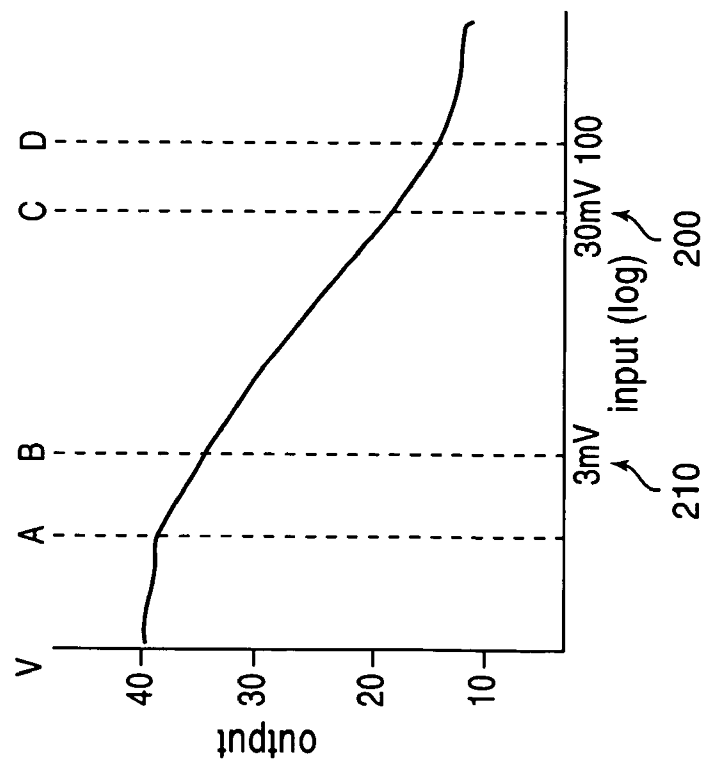
FIG. 2A includes a graph that illustrates the linear operation region of a circuit configured to control the gain of an outside amplifier, such as the LNA in FIG. 1.

FIG. 2A illustrates how a circuit such as, for example, the circuit illustrated in FIG. 1, may convert the values of the signals received through first input port 120 and second input port 125 into an inverse logarithmic function of these received signals, after these signals have been processed by the amplifiers and rectifiers of analog portion 100 and have been combined at Node A. It should be noted that the x-axis in FIG. 2A uses a logarithmic scale while the y-axis in FIG. 2A uses a linear scale.

In FIG. 2A, the above-discussed first threshold value 200 and second threshold value 210 have been indicated on the x-axis and have vertical dotted lines B and C running therethrough, respectively. To the left of line B and to the right of line C, vertical dotted lines A and D are illustrated. The curve illustrated in FIG. 2A descends linearly from top left to bottom right between lines A and D. However, to the left of line A and to the right of line D, the curve flattens out significantly. The region of the curve illustrated in FIG. 2A between lines A and D is referred to herein as the "linear signal region", wherein a relatively small change of the input signal amplitude causes a relatively large change of output signal that is linearly related thereto.

Outside of lines A and D, the circuit illustrated in FIG. 1 is substantially less responsive to fluctuations in the input signal received, for example, from LNA 110. Hence, in order to avoid the regions outside of lines A and D, the circuit illustrated is preferably operated between lines B and C.

Figure 3:
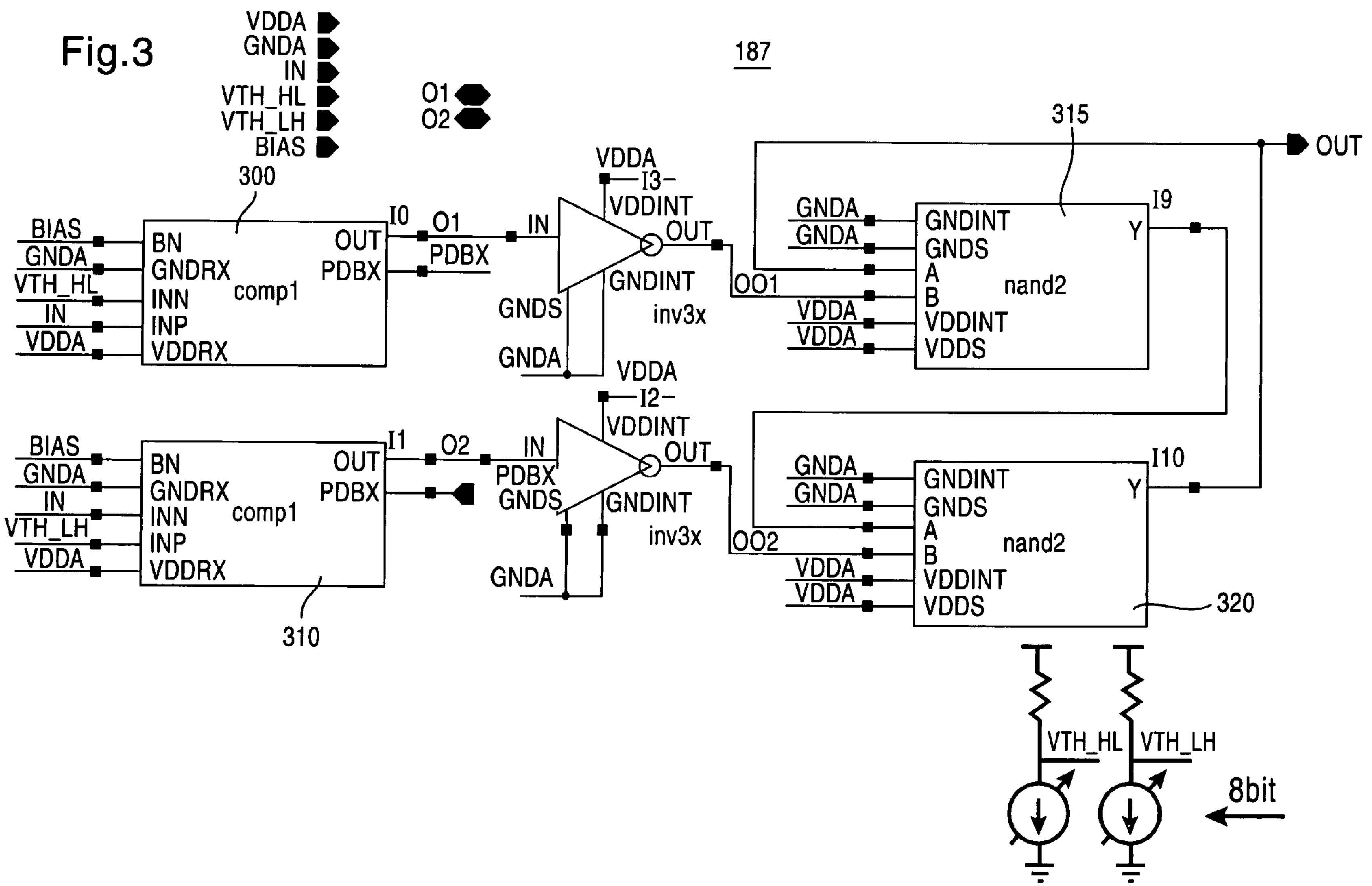
FIG. 3 illustrates a set of comparator circuits that may be included in a circuit configured to control the gain of an outside amplifier.

FIG. 3 illustrates an example of a comparator circuit 187 which may be used according to certain embodiments of the present invention. As illustrated in FIG. 3, two separate comparators 300, 310 are included in comparator circuit 187, and each of these comparators 300, 310 may be used with one of the above-discussed output threshold values. According to other embodiments of the present invention, a single comparator may be used, or more than two comparators may be used.

Comparator circuit 187 illustrated in FIG. 3 includes two decision circuits 315, 320 that are operably connected to the comparators 300, 310. In comparator circuit 187, if either decision circuit 315, 320 specifies that the gain of an outside amplifier operably (for example, LNA 110) connected to comparator circuit 187 should be switched, then the gain of the outside amplifier is switched accordingly. Otherwise, the outside amplifier is allowed to operate at the gain at which it was previously set.

Figure 4A:
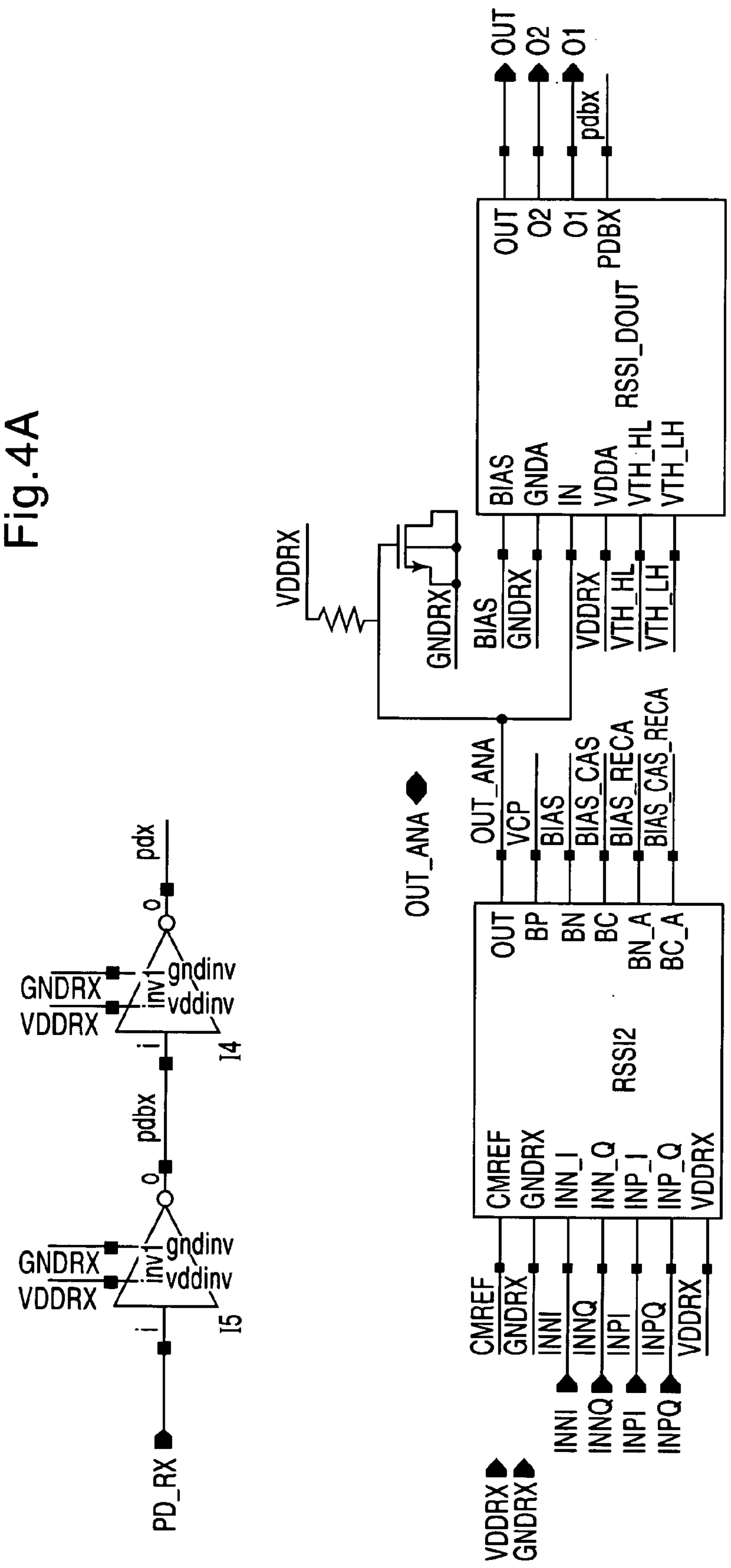
FIGS. 4A and 4B illustrate four-bit programmable resistive-divider-based circuitry that may be included in a circuit configured to control the gain of an outside amplifier.
Figure 4B:
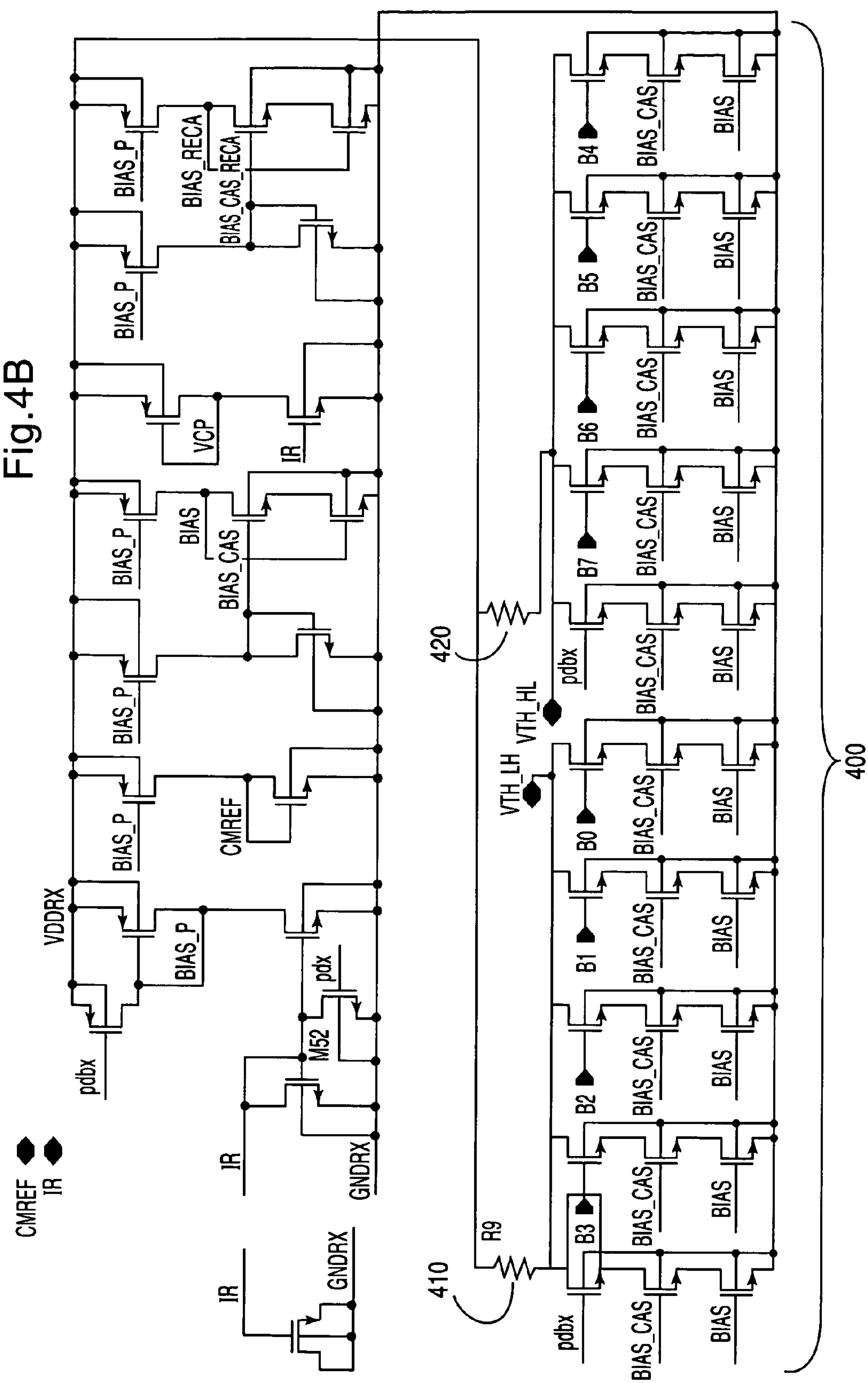

FIGS. 4A and 4B illustrate a representative threshold circuit 400 according to an embodiment of the present invention that may be included in comparator circuit 187. As shown in FIGS. 4A and 4B, threshold circuit 400 may be based on a resistive-divider circuit configured to specify a value of a threshold. In FIGS. 4A and 4B half of threshold circuit 400 stores data related to the value of a first threshold and the other half of threshold circuit 400 stores data related to the value of a second threshold. It will be appreciated by those skilled in the art that, in this example, data related to the values of additional thresholds may also be stored in threshold circuit 400 or in other similar circuits.

Threshold circuit 400 may be programmed in a manner that is independent of first portion 100 and/or second portion 105. For example, as illustrated in FIG. 1, three-wire controller 190 may be used to program the threshold circuit 400 in comparator circuit 187. Also, each threshold value stored in threshold circuit 400 may be stored as multiple-bits. For example, 4-bit programming may be used to store each of the threshold values.

In the device illustrated in FIG. 1, the value of the output signal from analog portion 100, which equals the value of the signal at input port 180 of digital portion 105, is compared with output threshold values provided by threshold circuit 400 in digital portion 105. For example, the value of the signal at input port 180 may be compared to the above-discussed 782 mV and 928 mV threshold values. Based on this comparison, a determination is made concerning whether or not the gain of the outside amplifier that is operably connected to output port 185 of digital portion 105 should be modified.

Threshold circuit 400 may include resistors 410 and 420, which can provide a connection between (in other words, short) the threshold ports VTH_HL and VTH_LH of the set of comparator circuits shown in FIG. 3 and VDD. Also, the comparator circuit shown in FIG. 3 may compare the signal received at input port 180 (or "IN" in FIG. 3) with threshold ports VTH_HL and VTH_LH. Hence, since all three of the ports discussed above are indirectly shorted to VDD through one or more resistors, all of the signals will experience substantially less variation as the voltage of a power supply operably connected to the circuit illustrated in FIG. 1 and FIG. 3 fluctuates over time. Therefore, the circuit illustrated in FIG. 1 will control the gain of an outside amplifier, such as LNA 110, using a relatively steady output signal, even as the voltage of the power supply operably connected to the WRSSI circuit varies over time.

In order to stabilize the circuit illustrated in FIG. 1 over temperature, the biasing circuits, illustrated in first portion 100 as combinations of amplifiers and rectifiers, are cascaded. Therefore, the configuration of the WRSSI circuit illustrated in FIG. 1 provides for a high degree of stability of the signal output from second portion 105, even as the temperature and process related to the circuit illustrated in FIG. 1 fluctuate over time. Usually, threshold values 200 and 210 illustrated in the example of FIG. 2B do not change by more than ±3 dB over any of the temperature, power supply, or process ranges over which the circuit illustrated in FIG. 1 may be operated.

Figure 5:
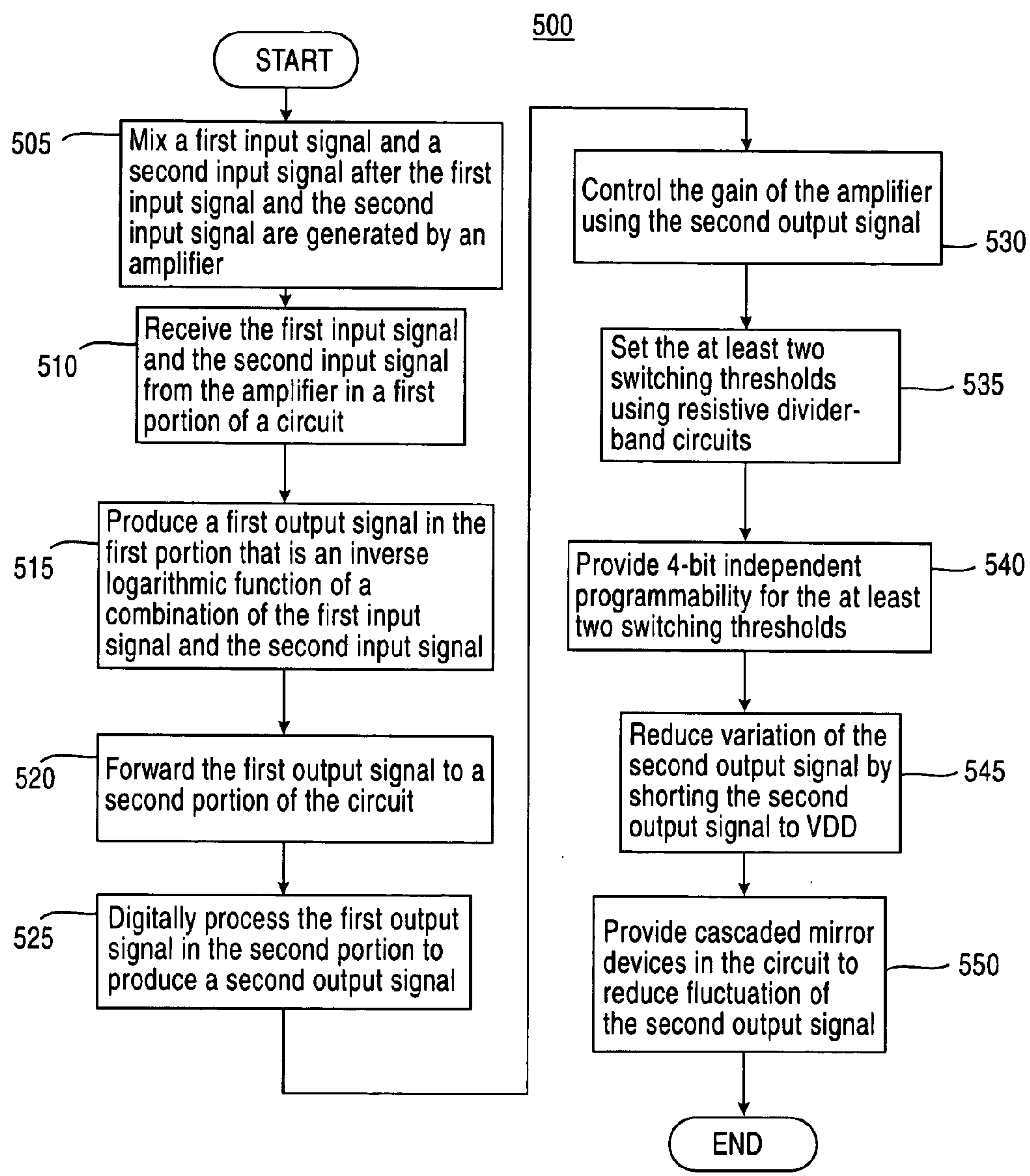
FIG. 5 illustrates a flow chart that includes steps of a representative method for controlling the gain of an outside amplifier.

FIG. 5 illustrates a flow chart 500 that includes steps of a representative method for controlling gain of an outside amplifier using a circuit such as, for example, the circuit illustrated in FIG. 1. Step 505 specifies mixing a first input signal and a second input signal after the first input signal and the second input signal have been generated by an amplifier. In FIG. 1, the first and second input signals of step 505 may be generated by LNA 110, which is outside of the circuit, and mixed by mixers 115.

Step 510 specifies receiving the first input signal and the second input signal, that are generally differential and 90° out-of-phase with each other, in a first portion of a circuit. In FIG. 1, such input signals are received at ports 120 and 125 of analog portion 100.

Step 515 specifies producing a first output signal in the first portion. According to step 515, the first output signal is an inverse logarithmic function of a combination of the first input signal and the second input signal.

Step 520 in FIG. 5 specifies forwarding the first output signal to a second portion of the circuit. In FIG. 1, this second portion is represented as digital portion 105. According to step 525, digital processing of the first output signal in the second portion is performed to produce the second output signal. This digitally processing step includes comparing the first output signal to at least two switching thresholds, such as threshold values 200 and 210 illustrated in FIG. 2A and discussed above.

According to step 530, controlling the gain of the amplifier may be performed using the second output signal. Step 535 specifies setting the at least two switching thresholds using resistive divider-based circuits. It should be noted that, according to step 540, 4-bit independent programmability may be provided for each switching thresholds illustrated here. It should be also noted that, according to step 545, fluctuation due to power supply variation of the second output signal may be reduced by shorting the second output signal to VDD. According to step 550, further stability may be provided by providing cascaded mirror devices in the bias-reference circuit to reduce current fluctuation of the second output signal.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A circuit for controlling gain of a first amplifier, the circuit comprising:

a first portion for receiving a first input signal and a second input signal from a second amplifier, and to produce a first output signal that is an inverse logarithmic function of a combination of the first input signal and the second input signal; and a second portion for digitally processing the first output signal and to produce a second output signal that controls the gain of the first amplifier.

2. The circuit of claim 1, wherein the first portion is configured to receive the first input signal and the second input signal from a first mixer and a second mixer that are each operably connected between the second amplifier and the first portion.

3. The circuit of claim 1, wherein the second portion comprises a comparator for comparing the first output signal to a threshold.

4. The circuit of claim 3, wherein the comparator is configured to switch the gain of the first amplifier when the threshold is reached.

5. The circuit of claim 3, further comprising a resistive-divider-based circuit for specifying a value of the threshold.

6. The circuit of claim 5, wherein the resistive-divider-based circuit is independently programmable.

7. The circuit of claim 6, wherein the resistive-divider-based circuit is 4-bit programmable.

8. The circuit of claim 1, wherein the first portion comprises at least two biasing circuits that are cascaded.

9. The circuit of claim 1, wherein the first output is operably connected to VDD.

10. A method of controlling gain of a first amplifier, the method comprising the steps of:

receiving a first input signal and a second input signal from a second amplifier in a first portion of a circuit;

producing a first output signal in the first portion that is an inverse logarithmic function of a combination of the first input signal and the second input signal;

forwarding the first output signal to a second portion of the circuit;

digitally processing the first output signal in the second portion to produce a second output signal; and controlling the gain of the first amplifier using the second output signal.

11. The method of claim 10, wherein the digitally processing step comprises comparing the first output signal to at least two switching thresholds.

12. The method of claim 11, further comprising the step of setting the at least two switching thresholds using resistive divider-band circuits.

13. The method of claim 11, further comprising the step of providing 4-bit independent programmability for each of the at least two switching thresholds.

14. The method of claim 10, further comprising the step of reducing fluctuation due to power supply variation by shorting the first output signal and threshold outputs to VDD through resistors.

15. The method of claim 10, wherein the controlling step comprises maintaining the first input signal in a range over which the first portion of the circuit varies the first output signal linearly in response to variations in the combination of the first input signal and the second input signal.

16. The method of claim 10, further comprising the step of providing cascaded mirror devices in the circuit to reduce fluctuation of the second output signal.

17. The method of claim 10, further comprising the step of mixing the first input signal and the second input signal after the first input signal and the second input signal are generated by the second amplifier.

18. A circuit configured to control gain of an amplifier, the circuit comprising:

receiving means for receiving a first input signal and a second input signal from the amplifier;

first production means for producing a first output signal that is an inverse logarithmic function of a combination of the first input signal and the second input signal;

processing means for digitally processing the first output signal; and second production means for producing a second output signal that controls the gain of the amplifier.

19. The circuit of claim 18, further comprising mixing means for mixing the first input signal and the second input signal after the first input signal and the second input signal are generated by the amplifier.

* * * * *